United States Patent
Hwang et al.

(10) Patent No.: US 11,043,740 B2
(45) Date of Patent: Jun. 22, 2021

(54) ENHANCED ANTENNA MODULE WITH SHIELD LAYER

(71) Applicant: QUALCOMM Incorporated, San Diego, CA (US)

(72) Inventors: Suhyung Hwang, Rancho Mission Viejo, CA (US); Chin-Kwan Kim, San Diego, CA (US); Hong Bok We, San Diego, CA (US); Jaehyun Yeon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/411,883

(22) Filed: May 14, 2019

(65) Prior Publication Data
US 2020/0365983 A1 Nov. 19, 2020

(51) Int. Cl.
*H01Q 1/52* (2006.01)
(52) U.S. Cl.
CPC .................. *H01Q 1/526* (2013.01)
(58) Field of Classification Search
CPC .......... H01Q 1/52; H01Q 1/243; H01Q 1/526; H01Q 1/2283
USPC .................. 343/700 MS, 702, 841
See application file for complete search history.

(56) References Cited

U.S. PATENT DOCUMENTS

| | | | |
|---|---|---|---|
| 6,452,549 B1 * | 9/2002 | Lo | H01Q 9/28 343/700 MS |
| 9,887,454 B2 | 2/2018 | Ito et al. | |
| 10,734,735 B2 * | 8/2020 | Kamgaing | H01Q 21/0087 |
| 2005/0088260 A1 | 4/2005 | Ajioka et al. | |
| 2011/0156225 A1 | 6/2011 | Hozoji et al. | |
| 2014/0028518 A1 * | 1/2014 | Arnold | H01L 23/66 343/841 |
| 2014/0035097 A1 | 2/2014 | Lin et al. | |
| 2018/0166767 A1 | 6/2018 | Ito et al. | |
| 2019/0334237 A1 * | 10/2019 | Khoury | H01Q 1/2291 |
| 2020/0185299 A1 * | 6/2020 | Chang | H01L 24/19 |

FOREIGN PATENT DOCUMENTS

| | | |
|---|---|---|
| CN | 102548373 A | 7/2012 |
| WO | 2019068009 A1 | 4/2019 |
| WO | 2019073809 A1 | 4/2019 |

OTHER PUBLICATIONS

International Search Report and Written Opinion for PCT/US2020/032584, dated Oct. 19, 2020, 25 pages.

* cited by examiner

*Primary Examiner* — Tung X Le
(74) *Attorney, Agent, or Firm* — Withrow & Terranova, PLLC

(57) ABSTRACT

Methods and apparatuses for enhancing antenna modules with a shield layer. The apparatus includes an antenna module having an antenna layer. The antenna layer includes an antenna. The antenna module further includes a signal routing layer; a radio frequency (RF) communication component disposed on the signal routing layer; a shield cover encasing the RF communication component; and a shield layer. The antenna module further includes an antenna module side. The antenna module side includes a side of the signal routing layer and a side of the antenna layer. The shield layer covers a portion of the antenna module side such that at least a portion of the side of the antenna layer is uncovered.

19 Claims, 6 Drawing Sheets

ENHANCED ANTENNA MODULE WITH SHIELD LAYER

BACKGROUND

Field

The present disclosure relates generally to methods and apparatuses having enhanced antenna module and more particularly, to enhanced antenna modules with shield layer.

Background

As demands for functions and services over wireless communication network grow, demands on antenna modules in apparatuses communicating over such networks increase accordingly. Such antenna modules may be configured to operate in different protocols, such as cellular protocols (5G, LTE, etc.), Wi-Fi, and Bluetooth at different frequency bands. The antenna modules may further be part of a multiple-input and multiple-output (MIMO) system. The demands may call for the antenna modules to communicate using more protocols, more frequency bands, and/or higher speeds. As a result, interferences (e.g., electrical-magnetic interferences) from and to the antenna modules grow. Accordingly, improvements in shielding the antenna module from interferences are desirable.

SUMMARY

This summary identifies features of some example aspects and is not an exclusive or exhaustive description of the disclosed subject matter. Additional features and aspects are described and will become apparent to persons skilled in the art upon reading the following detailed description and viewing the drawings that form a part thereof.

An apparatus in accordance with at least one embodiment includes an antenna module having an antenna layer. The antenna layer includes an antenna. The antenna module further includes a signal routing layer; a radio frequency (RF) communication component disposed on the signal routing layer; a shield cover encasing the RF communication component; and a shield layer. The antenna module further includes an antenna module side. The antenna module side includes a side of the signal routing layer and a side of the antenna layer. The shield layer covers a portion of the antenna module side such that at least a portion of the side of the antenna layer is uncovered.

A method for forming an antenna module incorporating an antenna, in accordance with at least one embodiment, includes forming a layer for shielding; depth drilling or singulation of the layer for shielding in a saw street; forming addition to the layer for shielding in the saw street; forming an insulation layer over the layer for shielding; and performing singulation over the saw street.

BRIEF DESCRIPTION OF THE DRAWINGS

Various aspects of apparatus and methods will now be presented in the detailed description by way of example, and not by way of limitation, with reference to the accompanying drawings, wherein.

DETAILED DESCRIPTION

Figure 1:
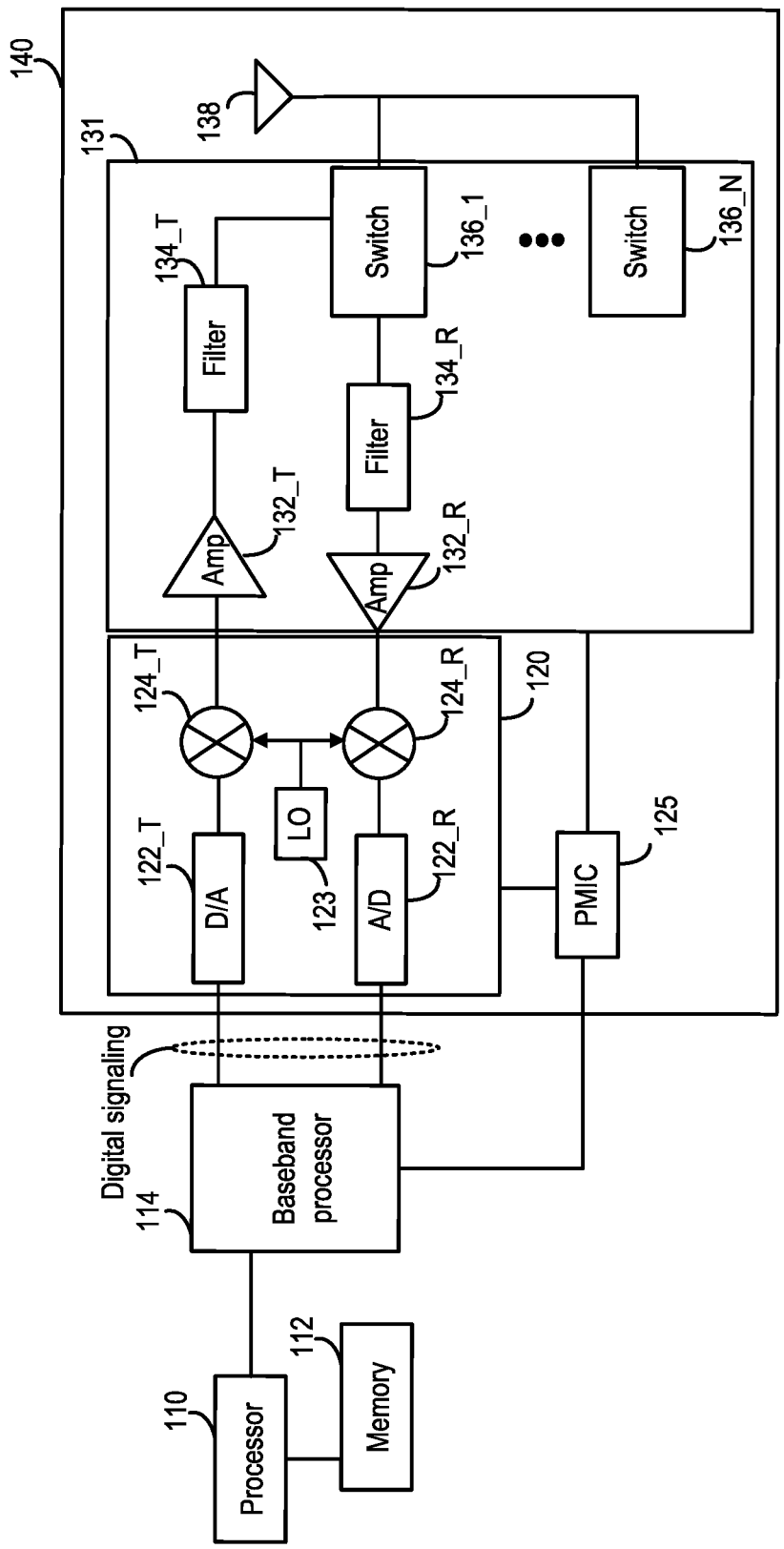
FIG. 1 illustrates the antenna module of FIG. 1, in accordance with certain aspects of the present disclosure.

The detailed description set forth below in connection with the appended drawings is intended as a description of various configurations and is not intended to represent the only configurations in which the concepts described herein may be practiced. The detailed description includes specific details for providing a thorough understanding of various concepts. However, it will be apparent to those skilled in the art that these concepts may be practiced without these specific details. In some instances, well known structures and components are shown in block diagram form to avoid obscuring such concepts.

As used herein, the term "coupled to" in the various tenses of the verb "couple" may mean that element A is directly connected to element B or that other elements may be connected between elements A and B (i.e., that element A is indirectly connected with element B), to operate certain intended functions. In the case of electrical components, the term "coupled to" may also be used herein to mean that a wire, trace, or other electrically conductive material is used to electrically connect elements A and B (and any components electrically connected therebetween). In some examples, the term "coupled to" mean a transfer of electrical energy between elements A and B, to operate certain intended functions.

In some examples, the term "electrically connected" mean having an electric current or configurable to having an electric current flowing between the elements A and B. For example, the elements A and B may be connected via resistors, transistors, or an inductor, in addition to a wire, trace, or other electrically conductive material and components. Furthermore, for radio frequency functions, the elements A and B may be "electrically connected" via a capacitor.

The terms "first," "second," "third," etc. are employed for ease of reference and may not carry substantive meanings. Likewise, names for components/modules may be adopted for ease of reference and might not limit the components/modules. For example, such non-limiting names may include "antenna" module or "shield" layer. Modules and components presented in the disclosure may be implemented in hardware, software, or a combination of hardware and software.

The term "bus system" may provide that elements coupled to the "bus system" may exchange information therebetween, directly or indirectly. In such fashion, the "bus system" may encompass multiple physical connections as well as intervening stages such as buffers, latches, registers, etc.

The term "disposed on," "on" (when used to described physical relationship), "affixed on" may indicate the elements being physically connected, either directly (no intervening elements therebetween) or indirectly (at least one additional element therebetween). Thus, in some examples, "disposed on" may indicate directly disposed on; "on" may indicate directly on; and/or "affixed" may indicate directly affixed. Terms including "surfaces," "ends," and "sides" may be used as references only and do not limit the disclosure.

As demands for communication grow, signal interference issue becomes increasingly difficult to manage. For example, demands may call for an antenna module to operate at higher speed and to function in multiple modes (e.g., different protocols of wireless communications, different paths in a MIMO system, different frequency bands, etc.). An antenna module may include one or more antennas and various RF communication components assembled as a single structure. The RF communication component may provide a means to facilitate RF communications (e.g., to provide signaling adjustments/conversion; e.g., between digital domain and analog domain). The RF communication components may include some portions or all of a transceiver, a power management integrated circuit (PMIC), passive components (e.g., capacitors or inductors), and/or radio frequency (RF) front-end. The RF front-end may be configured to adjust RF signaling and may include, for example, mixers, filters, or amplifiers (e.g., low-noise amplifiers or power amplifiers).

As complexity of the antenna module grows, the antenna module may experience increasingly more electromagnetic interferences (e.g., between the various RF communication components and the antenna). One measure to mitigate interference is to shield the RF communication components from the antenna, and vice versa. However, using such shielding may degrade performances of the antenna from transmitting and/or receiving RF signaling. Methods and apparatuses are presented and directed to enhanced antenna modules with shield layer that uncovers at least a portion of an antenna layer. The enhanced antenna modules provide shielding of the RF communication components while reducing performance degradation of the antenna (disposed on the antenna layer).

FIG. 1 illustrates components of an apparatus 100 having an antenna module 140, in accordance with certain aspects of the present disclosure. The apparatus 100 may, for example, be one of a computing system (e.g., servers, datacenters, desktop computers), mobile computing device (e.g., laptops, cell phones, vehicles, etc.), Internet of Things device, virtual reality system, or augmented reality system and may be configured to function an user equipment or a base station. FIG. 1 illustrates the apparatus 100 incorporating at least one processor 110, a memory 112, a baseband processor 114, and an antenna module 140. The baseband processor 114 is coupled to the memory 112 and may be configured to perform a computing function (e.g., graphic, displaying function, or sensing, etc., for the computing system, mobile computing device, Internet of Things device, virtual reality system, or augmented reality system) with the memory 112. For example, the memory 112 may store an instruction or data for the computing function.

The at least one processor 110 is coupled to the baseband processor 114 to perform, for example, wireless communications. The baseband processor 114 is coupled to the antenna module 140 and may be configured to operate RF communicating functions via wireless communication networks. For example, the baseband processor 114 may be configured to formulate logic layers and physical layers signaling based on protocols of the wireless communication networks (e.g., 5G, LTE, Wi-Fi, Bluetooth, etc.) in digital domain. The baseband processor 114 may be configured to output to (or to input from) the antenna module 140 for transmission (or receiving) of RF signaling via the antenna module 140.

The antenna module 140 includes an antenna 138, which provides a means to transmit or to receive RF signals for the wireless communication networks. The antenna module 140 may be configured to include RF communication components functionally coupling the baseband processor 114 and the antenna 138 to facilitate RF communications. The antenna module 140 includes, as examples of RF communication components, a transceiver 120, a power management integrated circuit (PMIC) 125, and an RF front-end 131. The antenna module 140 may include some or all of the components illustrated in FIG. 1, including passive components (such as inductors and capacitors) and other components that are part of the RF communication components (but not shown).

The PMIC 125 may be configured to provide power to the transceiver 120 (and/or the RF front-end 131). The transceiver 120 may be configured to convert digital signaling from the baseband processor 114 to RF signaling in a carrier frequency for transmission by the antenna 138 and/or, to convert RF signals at the carrier frequency received from the antenna 138 into digital signaling for the baseband processor 114. FIG. 1 illustrates that the transceiver 120 includes an analog-to-digital converter (ADC) 122_T, a digital-to-analog converter (DAC) 122_R, a local oscillator 123, and mixers 124_T and 124_R. The ADC 122_T and the DAC 122_R may convert signaling between analog and digital domains. The local oscillator 123 may generate a carrier-frequency reference signal, and the mixers 124_T and 124_R may mix the carrier-frequency reference signal with signals received from or to be transmitted by the antenna 138, via the RF front-end 131.

The RF front-end 131 may be configured to select and to adjust RF signals for transmission or RF signals received by the antenna 138. FIG. 1 illustrates that the RF front-end 131 includes amplifiers 132_T and 132_R, filters 127_T and 127_R, and switches 136-1 to 136-N. The amplifiers 132_T and 132_R may increase amplitudes of signaling. The filters 134_T and 134_R may remove unwanted signaling (e.g., unwanted frequency bands or interferences). The switches 136-1 to 136-N (which in some examples, may include duplexers) may switch between providing signals to and receiving signals from the antenna 138, between signaling paths in a multiple-input and multiple-output system, between different wireless communication protocols, or different frequency bands.

Figure 2A:
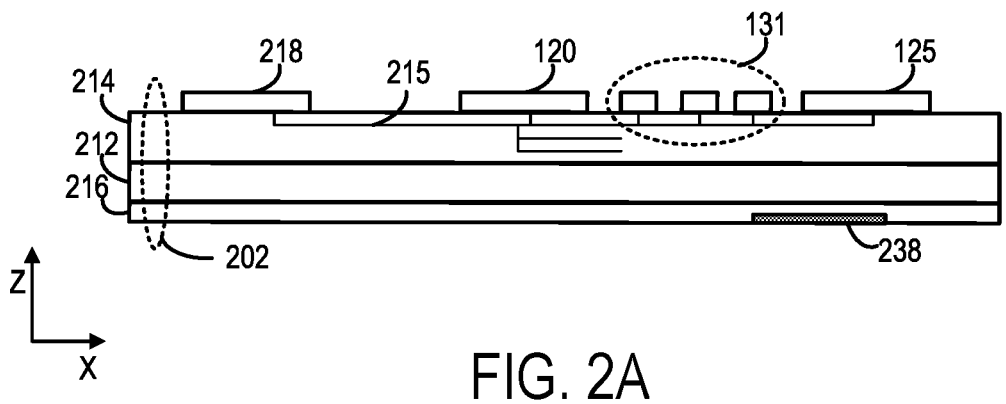
FIG. 2A illustrates a physical representation of an antenna module shown without shield cover.

FIG. 2A illustrates a physical representation of an antenna module shown without shield cover. For reference, FIG. 2 is presented with respect to orthogonal axes X, Y, Z. FIG. 2A illustrate an antenna module side 202 of an antenna module 200 shown without shield cover. For the antenna module side 202, X is the horizontal axis, and Z is the vertical axis. As illustrated, the antenna module 200 includes a core layer 212 to provide, for example, structure integrity of the antenna module 200 and/or to support components on the antenna module 200. The antenna module 200 further includes an antenna 238, an antenna layer 216, and a signal routing layer 214. The signal routing layer 214 is shown with multiple layers of conductive routings 215. The antenna module 202 further includes a socket 218 to attach the antenna module 200 to other boards or components. The antenna module 200, as illustrated, also includes the transceiver 120, the PMIC 125, and the RF front-end 131 (FIG. 1) coupled or electrically coupled to each other and to the socket 218 via conductive routings 215. The antenna 238 may be on (e.g., directly on) the antenna layer 216.

Figure 2B:
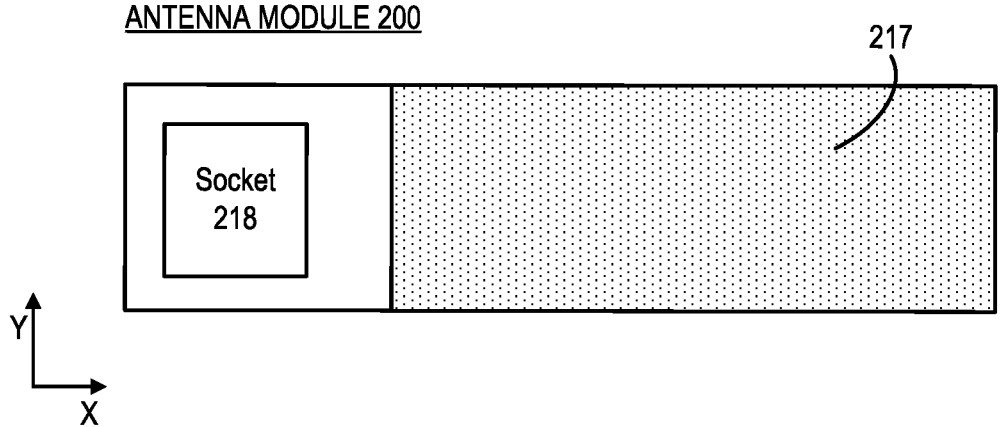
FIG. 2B illustrates a physical representation of the antenna module of FIG. 2A with shield cover.

To mitigate interferences to and from the transceiver 120, the PMIC 125, and the RF front-end 131, shielding may be added to the antenna module 200 via a shield cover 217. FIG. 2B illustrates a physical representation of the antenna module 200 of FIG. 2A with shield cover. FIG. 2B provides a top view of a surface 204 of the antenna module 200 with the shield cover 217. For the surface 204, X is the horizontal axis, and Y is the vertical axis. As illustrated, the shield cover 217 covers the transceiver 120, the PMIC 125, and the RF front-end 131 to mitigate interferences (e.g., electromagnetic interferences) to and from these components.

Figure 2C:
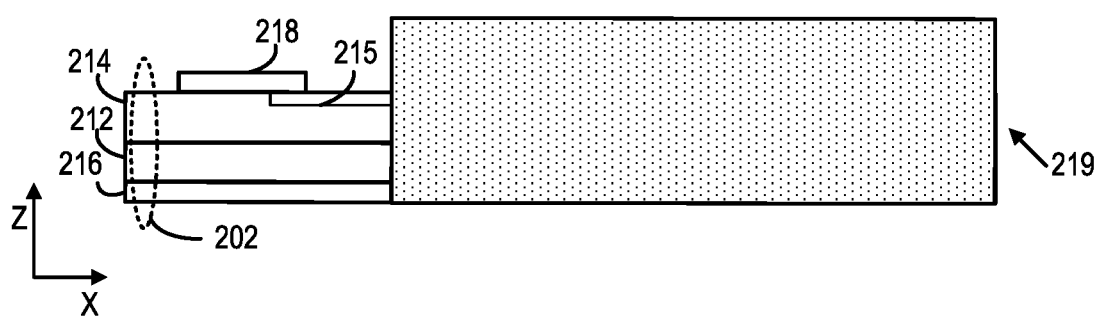
FIG. 2C illustrates another physical representation of the antenna module of FIG. 2A with shield cover.

FIG. 2C illustrates another physical representation of the antenna module of FIG. 2A with shield cover. For the antenna module side 202, X is the horizontal axis, and Z is the vertical axis. As illustrated, the antenna module side 202 includes a side of the core layer 212, a side of the signal routing layer 214, and a side of the antenna layer 216. The shield cover 217 extends to the antenna module side 202 and covers portions of the side of the core layer 212, the side of the signal routing layer 214, and side of the antenna layer (and the antenna 238). The shield cover 217 may further include a surface of the X and Y axes (not seen in FIG. 2) covering an end 219 of the antenna module 200.

The shield cover 217 may shield the RF communication components from electromagnetic interferences (e.g., unwanted RF signaling). Since the transceiver 120, the PMIC 125, and/or the RF front-end 131 are covered by the shield cover 217, interferences to and from those components are attenuated. However, since portions of the antenna layer 216 (e.g., part of the antenna module side 202 or the end 219) and/or of the antenna 238 are also covered by the shield cover 217, performances (e.g., RF signal transmission and/or receiving) of the antenna 238 may degrade. When demands call for high performance, such degradation may materially affect meeting the demands.

Figure 3A:
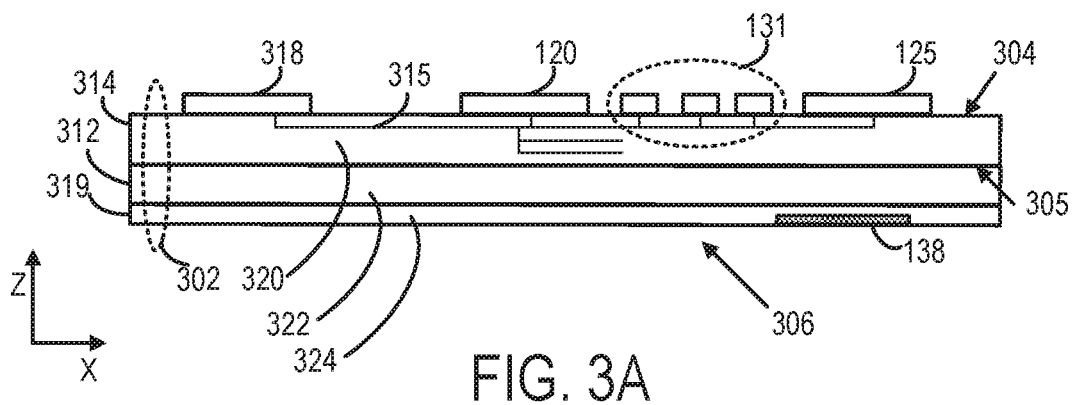
FIG. 3A illustrates a physical representation of the antenna module of FIG. 1 shown without shielding, in accordance with certain aspects of the present disclosure.

FIG. 3A illustrates a physical representation of the antenna module 140 of FIG. 1 shown without shielding, in accordance with certain aspects of the present disclosure. The antenna module 140 may have a top surface or a bottom surface upon with the antenna 138 disposed. The antenna module 140 may have sides. For reference, some of the sides may be referred to as ends. For reference, FIG. 3A is presented with respect to orthogonal axes X, Y, Z. For references, areas in a X-Y plane may be referred to as surfaces. Areas in a X-Z plane may be referred to as sides. Areas in a Y-Z plane may be referred to as ends. The X-Y plane, the X-Z plane, and the Y-Z plane may be orthogonal to each other.

The antenna module side 302 is illustrated in the X-axis and the Z-axis, without a shield cover and without a shield layer for illustrative purpose. The X-axis is the horizontal axis, and the Z-axis is the vertical axis. As illustrated, the antenna module 140 includes a core layer 312, an antenna layer 319, and a signal routing layer 314. The antenna 138 (FIG. 1) is on (e.g., directly on) the antenna layer 319 (e.g., on the bottom surface 306). The antenna module side 302 includes a side (e.g., side 320) of the signal routing layer 314, a side (e.g., side 322) of the core layer 312, and a side (e.g., side 324) of the antenna layer 319. The RF communication components, such as the transceiver 120, the RF front-end 131, or the PMIC 125 (see FIG. 1) or parts these components may be disposed on (e.g., directly on) the signal routing layer 314. A socket 318 may be disposed on (e.g., directly on) the signal routing layer 314 (e.g., on the first surface 304).

The core layer 312 may be configured to provide, for example, structure integrity of the antenna module 140 and/or to support other layers and/or components on the antenna module 140. The antenna 138 (FIG. 1) may include, for example, a patch or a dipole antenna. The antenna layer 319 may be disposed onto the core layer 312 directly or via other layers. The signal routing layer 314 may electrically connect, for example, the RF communication components, such as the transceiver 120, the RF front-end 131, or the PMIC 125 and other components of the apparatus 100 of FIG. 1 (e.g., via the socket 318).

The signal routing layer 314 may be configured to include one or more layers of conductive routings 315. The signal routing layer 314 has a first surface 304 and a second surface 305, the second surface 305 facing the antenna layer 319 and opposing the first surface 304. The RF communication components (e.g., the transceiver 120, the RF front-end 131, the PMIC 125, and/or the socket 318, or parts thereof) are disposed on the first surface 304 of the signal routing layer 314. The RF communication components may be electrically connected by the conductive routings 315 to each other and/or to the socket 318.

The socket 318, disposed on the first surface 304 of the signal routing layer 314, may be configured to attach and/or to electrically connect the antenna module 140 to other boards or components. For example, referring to FIG. 1, the at least one processor 110, the memory 112, and/or the baseband processor 114 may be attached or electrically connected to the antenna module 140 (e.g., to the RF communication components on the antenna module 140) via the socket 318.

Figure 3B:
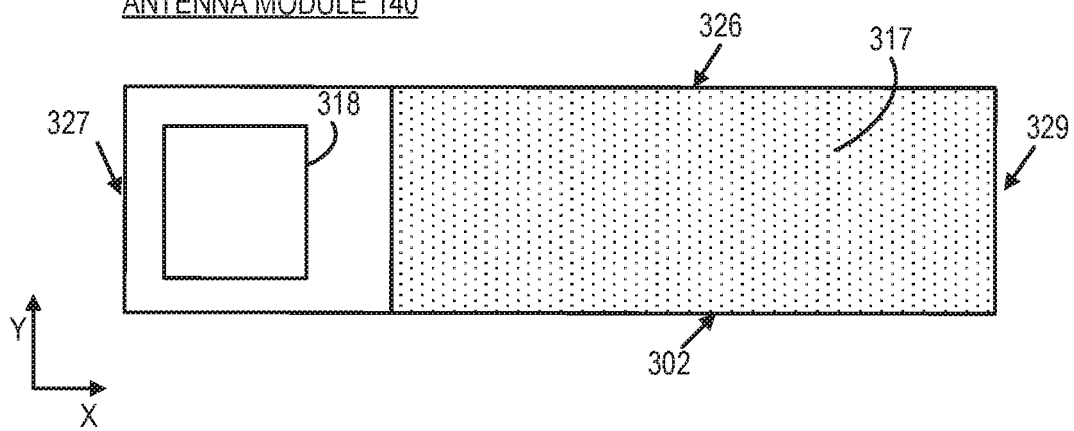
FIG. 3B illustrates a physical representation of the antenna module of FIG. 1 with shielding, in accordance with certain aspects of the present disclosure.

FIG. 3B illustrates a physical representation of the antenna module 140 of FIG. 1 with shielding, in accordance with certain aspects of the present disclosure. A first surface 304 (e.g., a top surface) of a signal routing layer 314 (of the antenna module 140) is covered by a shield cover 317. The antenna module 140 has an antenna module side 302 and a second antenna module side 320. The first surface 304 of the signal routing layer 314 (and of the antenna module 140) is illustrated with X-axis as horizontal axis and Y-axis as vertical axis. A shield cover 317 encases or covers some or all of the RF communication components, such as the transceiver 120, the RF front-end 131, or the PMIC 125, on the signal routing layer 314. An antenna module side 302 and a second antenna module side 326 (having X-axis as horizontal axis and Z-axis as vertical axis) may be between the first surface 304 of the signal routing layer 314 and a bottom surface 306 of the antenna module 140. An antenna module end 329 (having Y-axis as horizontal axis and Z-axis as vertical axis) may likewise be between the first surface 304 of the signal routing layer 314 and the bottom surface 306 of the antenna module 140. A second antenna module end 327 opposes the antenna module end 329.

In some examples, the shield cover 317 may include multiple layers. The shield cover 317 may including molding over the covered RF communication components, thereby encasing the covered RF communication components. The shield cover 317 may further include a steel or nickel layer to provide electromagnetic shielding function. The shield cover 317 may be configured to protect the covered RF communication components from electromagnetic interfaces from, for example, the antenna 138 and/or sources outside of the apparatus 100 (FIG. 1). The shield cover 317 may be configured to protect, for example, the antenna 138 and/or components outside of the apparatus 100 from electromagnetic interfaces arising from the covered RF communication components.

Figure 3C:
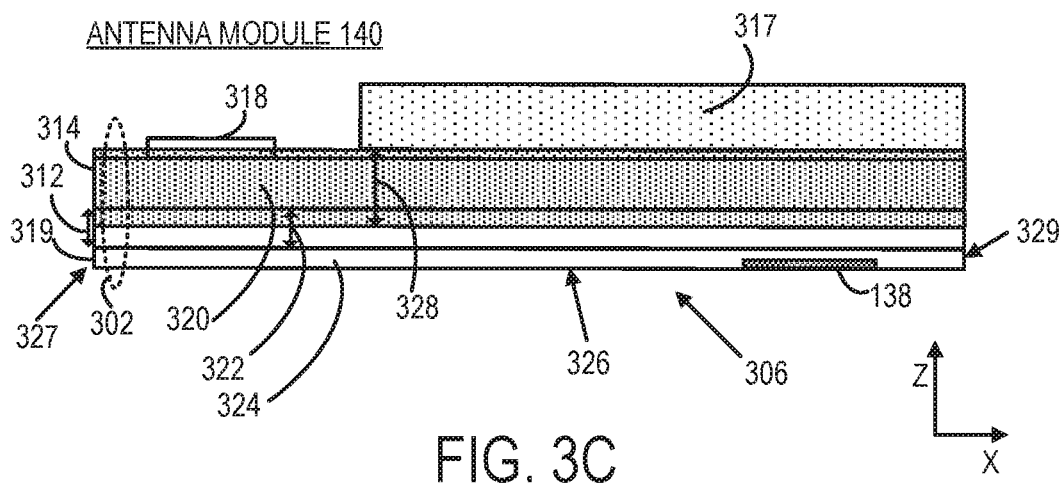
FIG. 3C illustrates a physical representation of the antenna module of FIG. 1 with shielding, in accordance with certain aspects of the present disclosure.

FIG. 3C illustrates a physical representation of the antenna module of FIG. 1 with shielding, in accordance with certain aspects of the present disclosure. The antenna module side 302 is partially covered by the shield cover 317 and a shield layer 328. The X-axis is the horizontal axis, and the Z-axis is the vertical axis. As illustrated, the antenna module side 302 is between the first surface 304 and a bottom surface 306 of the antenna module 140. The antenna module side 302 includes the side 320 of the signal routing layer 314 (illustrated as covered by the shield layer 328) and the side 324 of the antenna layer 319. The antenna module side 302 may also include a side 322 of the core layer 312 (illustrated having a portion of which covered by the shield layer 328).

The shield layer 328 may cover a portion of the antenna module side 302 (e.g., not all of the side 324 of the antenna layer 319 is covered) such that at least a portion of the side 324 of the antenna layer 319 and/or the antenna 138 is uncovered. In some examples, the shield layer 328 covers all of the side of the signal routing layer 320. In some examples, the shield layer 328 may include copper. In some examples, the shield layer 328 and the shield cover 317 may be of different materials (e.g., at least one type of material is different). In some examples, the shield layer 328 and the shield cover 317 are two different structures.

The second antenna module side 326 (reference shown with the first surface 304) opposes the antenna module side 302. Similar to the antenna module side 302, the second antenna module side 326 includes a second side of the signal routing layer 314 (not seen) and a second side of the antenna layer 319 (not seen). The shield layer 328 covers a portion of the second antenna module side 326 (e.g., not all of the second side of the antenna layer 319 is covered) such that at least a portion of the second side of the antenna layer 319 and/or the antenna 138.

Figure 4:
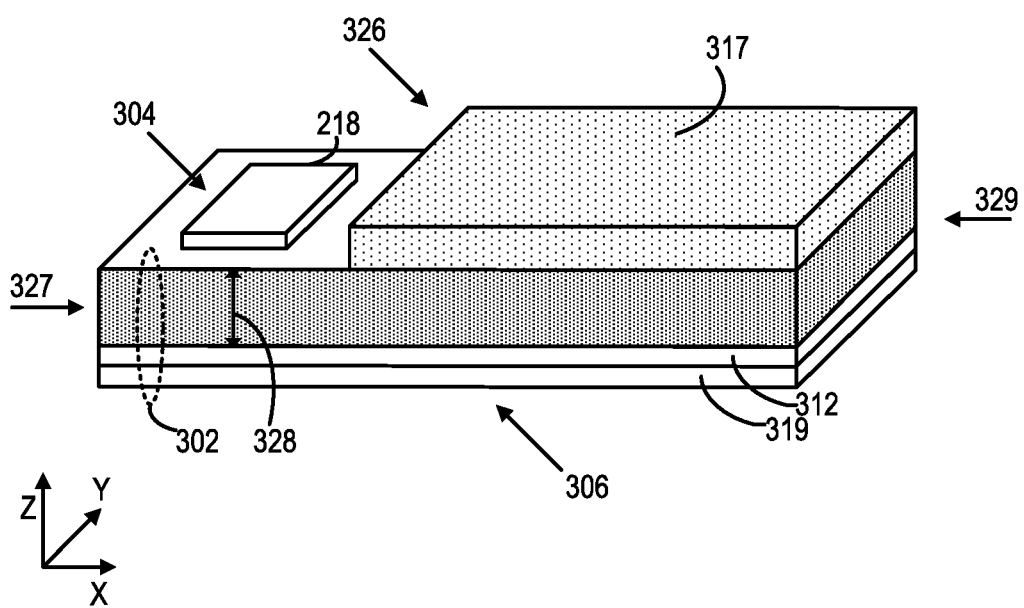
FIG. 4 illustrates a perspective view of the antenna module, in accordance with certain aspects of the present disclosure.

FIG. 4 illustrates a perspective view of the antenna module 140, in accordance with certain aspects of the present disclosure. The X, Y, and Z axes are shown in perspective view. For example, the antenna module end 329 (see also the first surface 304 in FIG. 3) (in a plane of Y and Z axes) may be between to the first surface 304 and to the antenna module side 302 and the second antenna module side 326 (not seen in this view). The antenna 138 is not seen in this view. The shield layer 328 may include a portion on the first surface 304 and/or the second surface 305 of the signal routing layer 314 (FIG. 3) not shown in this figure. For example, the first surface 304 of the signal routing layer 314 may include a protective layer that covers the portion of the shield layer 328 on the on the first surface 304 of the signal routing layer 314 such that the portion of the shield layer 328 on the on the first surface 304 of the signal routing layer 314 is not seen in FIG. 4.

The antenna module end 329 includes an end of the signal routing layer 314 and an end of the antenna layer 319. The shield layer 328 covers a portion of the antenna module end 329 (e.g., not all of the antenna module end 329 is covered) such that at least a portion of the antenna layer 319 and/or the antenna 138 is uncovered. A second antenna module end 327 (shown with the first surface 304 in FIG. 3) opposes the antenna module end 329 and is likewise orthogonal to the first surface 304 and to the antenna module side 302 and the second antenna module side 326 (not seen in this view). The second antenna module end 327 is not seen in this view.

Figure 5:
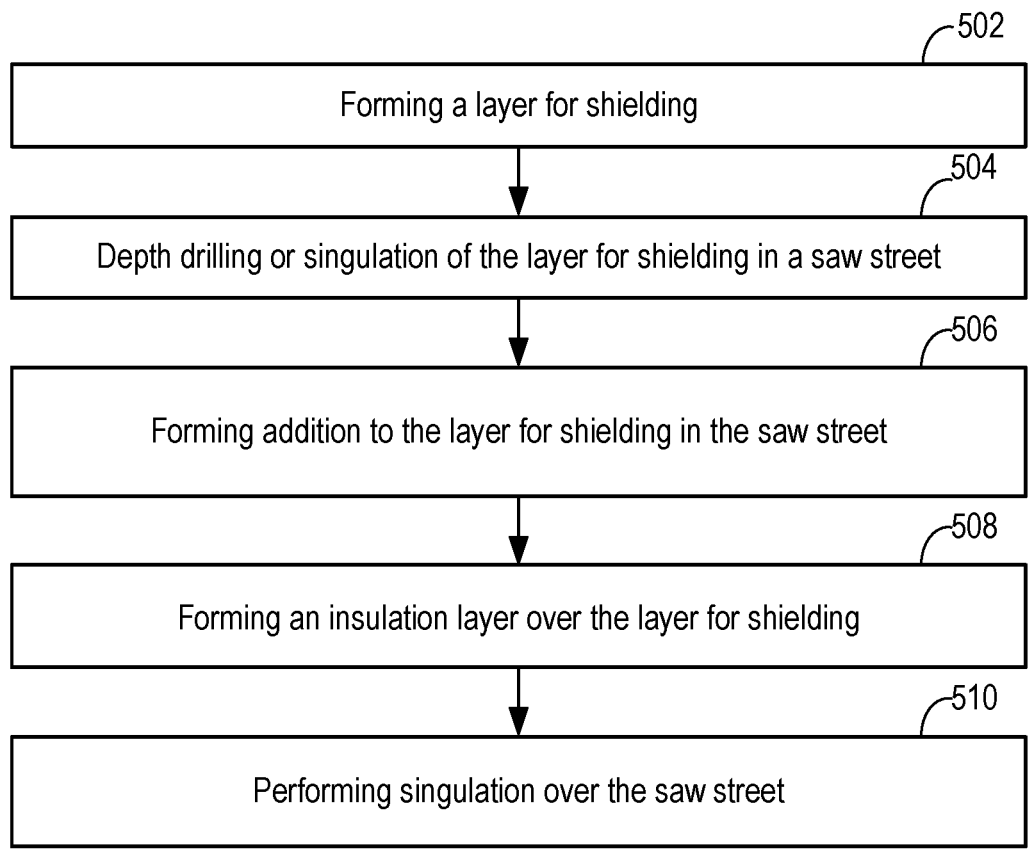
FIG. 5 illustrates a method to manufacturing the antenna apparatus of FIG. 1, in accordance with certain aspects of the present disclosure.
Figure 6:
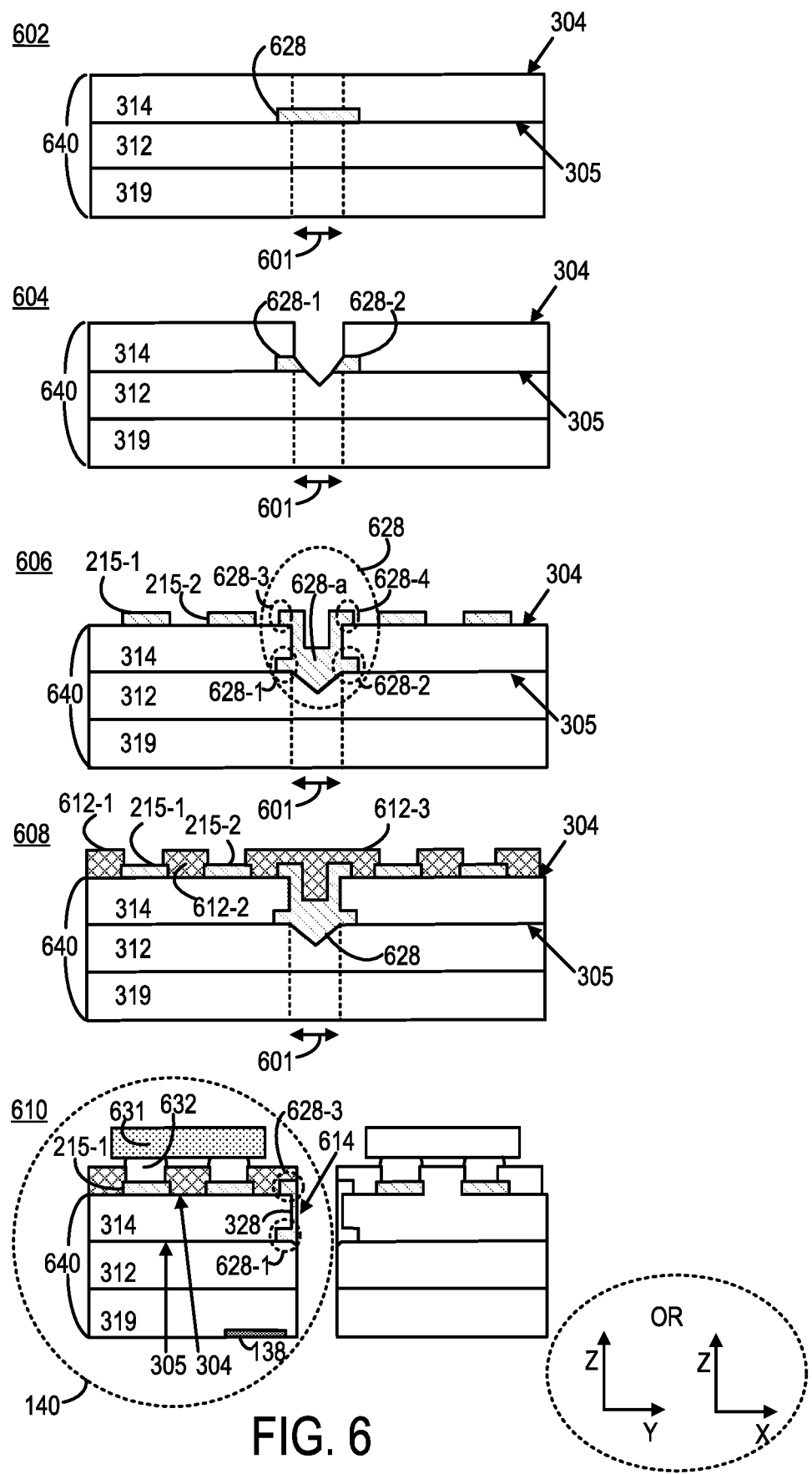
FIG. 6 stages in manufacturing of the antenna apparatus of FIG. 1, in accordance with certain aspects of the present disclosure.

FIG. 5 illustrates a method to manufacturing the antenna module 140 of FIG. 1, in accordance with certain aspects of the present disclosure. FIG. 6 illustrates stages in manufacturing of the antenna module 140 of FIG. 1, in accordance with certain aspects of the present disclosure. At 502 (FIG. 5), a layer for shielding is formed. Referring to 602 (FIG. 6), a substrate 640 includes a signal routing layer 314, a core layer 312, and an antenna layer 319 (see FIG. 3). The signal routing layer 314 includes a first surface 304 and a second surface 305, the second surface 305 facing the antenna layer 319 and opposing the first surface 304. As illustrated, a layer for shielding 628 is formed on the second surface 305 of the signal routing layer 314 and/or on the core layer 312. The layer for shielding 628 may be, for example, copper and may become part of the shield layer 328 (see FIG. 3). A saw street 601 is illustrated. The saw street 601 may be an area to be sawed or otherwise severed to separate the modules, thereby forming the antenna module 140.

At 504 (FIG. 5), the layer for shielding 628 is depth drilled or singulation performed in the saw street 601. Referring to 604 (FIG. 6), a top portion of the layer for shielding 628 (in the saw street 602) is removed by depth drilling or other means of singulation (e.g., etching) to form two portions of the layer for shielding 628 (e.g., portion 628-1 and 628-2). The portions of the layer for shielding 628-1 and 628-2 are on (e.g., directly on) the second surface 305 (e.g., directly on) of the signal routing layer 314. The portions of the layer for shielding 628-1 and 628-2 may be on (e.g., directly on) the core layer 312.

At 506 (FIG. 5), addition to the layer for shielding is formed in the saw street. Referring to 606 (FIG. 6), addition 638-a is added to the layer for shielding (e.g., by deposition or sputtering of copper). A resulting layer for shielding 628 may incorporate portions of the layer for shielding 628-1 and 628-2 and the addition 638-a as a unitary layer. In some examples, the addition 638-a (and therefore the result layer for shield 628) may include a portion 628-3 or 628-4 on (e.g., directly on) the first surface 304 of the signal routing layer 314.

In some examples, conductive routings 215 (see FIG. 2), such as conductive routings 215-1 and 215-2 on the first surface 304 of the signal routing layer 314, may be formed at 506. For example, at least one of the conducive routings 215-1 and 215-2 may be formed in a same layering step with the addition 638-a, using copper. (e.g., forming the addition 638-a to the layer for shielding 628 may include forming at least one conductive routing 215-1 or 215-2 on the signal routing layer 314.) The resulting layer for shielding 628 would become the shield layer 328 (FIG. 3). Accordingly, the signal routing layer 314 may include at least one conductive routing 215-1 or 215-2, and the at least one conductive routing 215-1 or 215-2 and the shield layer 328 may include a same material (e.g., copper).

At 508 (FIG. 5), an insulation layer is formed over the layer for shielding. For example, referring to 608 (FIG. 6), insulation layers 612-1, 612-2, and 612-3 are form. For example, the insulation layer 612-3 may be formed over the layer for shielding 628 (e.g., in the saw street 601) to insulate the layer for shielding 628 from the conductive routing 215-1 and/or other components (e.g., RF communication components). The insulation layer 612-2 may also be formed at 508 to insulate among conductive routings 215-1 and 215-2 and/or other components (e.g., RF communication components).

At 510 (FIG. 5), singulation is performed over the saw street. For example, referring to 610 (FIG. 6), the saw street 601 may be etched, sawed, or otherwise severed to form the antenna module 140. In the resulting antenna module 140, the layer for shielding 628 becomes the shield layer 328 (see also FIGS. 3 and 4). The shield layer 328 includes the portion 628-3 on the first surface 304 and the portion 628-1 on the second surface 305 of the signal routing layer 314. The shield layer 328 includes a side or end 614 that covers a side or end of the antenna module 140. In some examples, referring to the first surface 304 of FIG. 3, the side or end 614 may correspond to the antenna module side 302 (the horizontal axis being the Y-axis, and the vertical axis being the Z-axis). Accordingly, the side or end 614 of the shield layer 328 covers all of a side of the signal routing layer 314. In some examples, referring to the first surface 304 of FIG. 3, the side or end 614 may correspond to the antenna module end 329 (the horizontal axis being the X-axis, and the vertical axis being the Z-axis). Accordingly, the side or end 614 of the shield layer 328 covers all of an end of the signal routing layer 314. In similar fashion, the side or end 614 may correspond the second antenna module side 326 or the second antenna module end 327 (FIG. 3). Thus, the side or end 614 of the layer for shielding 628 covers a side or end of the signal routing layer 314 such that a side or end of the antenna layer 319 and/or the antenna 138 is uncovered.

Other operations may be performed in the method to manufacturing the antenna module 140 of FIG. 1. For example, an RF communication component 631 (e.g., a portion of the transceiver 120, the PMIC 125, or an RF front-end 131 of FIG. 1) and/or a connection 632 may be added and disposed on the antenna module 140. The RF communication component 631 may be electrically connected to the conductive routing 215-1 of the signal routing layer 314 via the connection 632. The connection 632 may be, for example, a lead, a pin, a ball, or a conductive pillar. The insulation layer 612 (e.g., illustrated with 608) may electrically insulate the conductive routings 215 (e.g., insulate conductive routings 215-1 and 215-2), the conductive routings 215 and the layer for shield 628, the RF communication component 631 and the layer for shield 628, and/or the conductive routings 215 and the RF communication component 631. The antenna 138 may be added or formed and disposed on the antenna layer 319 (the antenna layer 319 is on the signal routing layer 314). The shield cover 317 (FIG. 3) may be added to cover the RF communication component 631.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. An apparatus, comprising:
   an antenna module, comprising:
      an antenna layer comprising an antenna;
      a signal routing layer;
      a shield cover encasing a portion of the signal routing layer;
      a radio frequency (RF) communication component disposed on the signal routing layer;
      the shield cover encasing the RF communication component; and
      a shield layer disposed between the shield cover and the antenna layer;
      wherein the antenna module further comprises an antenna module side,
      the antenna module side comprises a side of the signal routing layer and a side of the antenna layer, and
      the shield layer covers a portion of the antenna module side such that at least a portion of the side of the antenna layer is uncovered.

2. The apparatus of claim 1, wherein the shield layer covers all of the side of the signal routing layer.

3. The apparatus of claim 2, wherein:
   the antenna module further comprises a second antenna module side opposing the antenna module side,
   the second antenna module side comprises a second side of the signal routing layer and a second side of the antenna layer, and
   the shield layer covers a portion of the second antenna module side such that at least a second portion of the second side of the antenna layer is uncovered.

4. The apparatus of claim 2, wherein:
   the antenna module further comprises an antenna module end, the antenna module end comprising an end of the signal routing layer and an end of the antenna layer, and
   the shield layer covers a portion of the antenna module end such that at least a second portion of the end of the antenna layer is uncovered.

5. The apparatus of claim 2, wherein the shield layer comprises a portion on a surface of the signal routing layer.

6. The apparatus of claim 5, wherein the shield layer comprises the portion on the surface and a second surface of the signal routing layer.

7. The apparatus of claim 2, wherein the RF communication component comprises a transceiver, a power management integrated circuit (PMIC), or radio frequency front-end.

8. The apparatus of claim 7, wherein the RF communication component comprises the transceiver, the PMIC, and the radio frequency front-end.

9. The apparatus of claim 7, wherein the shield cover and the shield layer are of different materials.

10. The apparatus of claim 9, wherein the shield cover comprises steel.

11. The apparatus of claim 9, wherein the shield layer comprises copper.

12. The apparatus of claim 9, wherein the signal routing layer comprises at least one conductive routing, the at least one conductive routing and the shield layer comprising a same material.

13. The apparatus claim 9, wherein one of a computing system, a mobile computing system, an Internet of Things device, a virtual reality system, or an augmented reality system incorporating the antenna module and at least one processor are configured to perform a computing function of the one of the computing system, the mobile computing system, the Internet of Things device, the virtual reality system, or the augmented reality system.

14. A method for forming an antenna module incorporating an antenna, comprising:
    forming an antenna on an antenna layer;
    forming a signal routing layer disposed between a shield cover and the antenna layer;
    forming a layer for shielding in the signal routing layer;
    depth drilling or singulating the layer for shielding in a saw street;
    forming an addition to the layer for shielding in the saw street;
    forming an insulation layer over the layer for shielding; and
    performing singulation over the saw street;
    the shield cover encases a portion of the signal routing layer,
    the antenna layer is on a signal routing layer, and
    a side or end of the layer for shielding covers a side or end of the signal routing layer such that a side or end of the antenna layer is uncovered.

15. The method of claim 14, wherein the layer for shielding comprises a portion on a first surface of the signal routing layer or a portion on a second surface of the signal routing layer.

16. The method of claim 15, wherein the layer for shielding comprises the portion on the first surface of the signal routing layer and the portion on the second surface of the signal routing layer.

17. The method of claim 15, wherein forming the addition to the layer for shielding further comprises forming a conductive routing on the signal routing layer.

18. The method of claim 17, further comprising: adding a radio frequency (RF) communication component on the signal routing layer; and
    adding the antenna on the antenna layer.

19. The method of claim 17, wherein the insulation layer insulates the conductive routing and the layer for shielding.

* * * * *